United States Patent [19]

Matthews

[11] Patent Number: 5,687,279
[45] Date of Patent: Nov. 11, 1997

[54] RETRO-STORING ANALOG INFORMATION IN A DIGITAL STORAGE CIRCUIT

[75] Inventor: Walter S. Matthews, Folsom, Calif.

[73] Assignee: Intel Corporation, Santa Clara, Calif.

[21] Appl. No.: 363,379

[22] Filed: Dec. 23, 1994

[51] Int. Cl.$^6$ .................................................. G11B 17/22
[52] U.S. Cl. ................................................ 395/2.1; 369/30
[58] Field of Search ........................... 365/45; 395/2.1, 395/2.79, 2.87, 2.09; 369/30, 32, 33, 34

[56] References Cited

U.S. PATENT DOCUMENTS

| | | | |
|---|---|---|---|
| 4,644,494 | 2/1987 | Muller | 364/900 |
| 4,890,259 | 12/1989 | Simko | 365/45 |
| 4,989,179 | 1/1991 | Simko | 365/45 |
| 5,126,967 | 6/1992 | Simko | 365/45 |
| 5,241,494 | 8/1993 | Blyth et al. | 365/45 |
| 5,442,603 | 8/1995 | Kim | 369/32 |
| 5,513,136 | 4/1996 | Fandrich et al. | 365/185.04 |
| 5,534,929 | 7/1996 | Tanaka | 348/405 |

OTHER PUBLICATIONS

Trevor Blyth et al., "A Non-Volatile Analog Storage Device Using EEPROM Technology," 1991 IEEE Int'l Solid–State Circuits Conf. Digest of Technical Papers, pp. 192–194 (Feb. 1991).

*Primary Examiner*—Allen R. MacDonald
*Assistant Examiner*—Richemond Dorvil
*Attorney, Agent, or Firm*—Blakely, Sokoloff, Taylor & Zafman

[57] ABSTRACT

A method for retro-storing analog information in a memory circuit first processes first analog data into first digitized data. The first digitized data are then stored in the memory circuit. Second analog data are then received and processed into second digitized data. If storage of the analog information is now required, the second digitized data are stored with the first digitized data in the memory circuit. If storage is not required, the first digitized data are deleted from the memory circuit and the second digitized data are stored in the memory circuit. An integrated storage circuit for retro-storing and retrieving analog information is also described. The circuit includes a control circuit for controlling a processing circuit to store digitized analog data in a non-volatile memory in response to a control signal. When the control signal is not asserted, the control circuit controls the digitized analog data to be stored in the buffer circuit in a closed loop manner. When the control signal is asserted, the control circuit controls (1) the digitized analog data received after the control signal is enabled and (2) the digitized analog data already stored in the buffer circuit into the nonvolatile memory.

18 Claims, 6 Drawing Sheets

5,687,279

RETRO-STORING ANALOG INFORMATION IN A DIGITAL STORAGE CIRCUIT

FIELD OF THE INVENTION

The present invention pertains to the field of digital storage of analog signal information. More particularly, this invention relates to apparatus and a method of retro-storing analog information in a memory.

BACKGROUND OF THE INVENTION

Many devices are known for electronic storage of analog information. In a typical prior art device using digital storage techniques, the underlying information is essentially analog, which must be stored electronically in digital form. A common analog signal to be digitally recorded is the output signal of a microphone, which is passed through an analog-to-digital (A/D) converter which supplies the digital output information to a memory (e.g., flash electrically erasable and programmable read-only memory). In order to play back the stored audio information from the memory, the contents of the memory must first pass through a digital-to-analog (D/A) converter to be reconverted into analog form. The D/A converter then sends the converted signal through an amplifier to a speaker.

The advances in audio compression technology and flash memory technology have allowed digital storage of clean and clear audio recording in a single flash memory chip to be possible and relatively economically made. For example, a 25 minute telephone conversation can now be digitally stored in 1 Mbits (megabits) of flash memory. This thus allows the prior art technology of digital storage of audio information in a flash memory to be employed in many industrial applications. One such application is in the flight recorder of an airplane. This allows the flight recorder retain the stored data when subjected to high impact forces attendant the aircraft crash and, if the aircraft burns, when subjected to high temperatures resulted from the burning.

Another application of the prior art technology of digital storage of analog information in a flash memory is in the audio recording system. This allows the audio recording system to be configured without mechanically driven components. The mechanically driven audio recording system typically has a relatively large physical size, consumes relatively large amount of power, and is prone to failure if exposed to excessive shock and vibration or to dust or other atmospheric contaminants.

Continuous loop recording technology is well known in the art and is used in a number of applications. One specific application of the continuous loop recording is court recording where the audio file is used to help typing the transcription. Another application of the continuous loop recording is the flight recorder for an airplane as described above. However, because memory cells of the flash memory typically cannot be overwritten from a programmed state to an erased state without a prior erasure and the erasure operation is typically performed on large blocks or the entire memory array of the flash memory, it is typically difficult to use the flash memory for continuous loop storage of information.

SUMMARY AND OBJECTS OF THE INVENTION

One of the objects of the present invention is to allow retro-storage of analog information in a digital storage circuit.

Another object of the present invention is to retro-store analog information in a digital storage integrated circuit by first storing a packet of digitized data into a buffer such that if a subsequent packet of digitized data requires storage, this packet and the subsequent packet are then both stored in a nonvolatile memory.

A method for retro-storing analog information in a memory circuit includes the step of receiving and processing first analog data into first digitized data for storage in the memory circuit. The first digitized data are then stored in the memory circuit. Second analog data are then received and processed into second digitized data for storage in the memory circuit. A determination is made to determine if storage of the analog information is required. If storage of the analog information is required, the second digitized data are stored along with the first digitized data in the memory circuit. When the second digitized data are required to be retrieved, the first and second digitized data are retrieved from the memory circuit. If storage of the analog information is not required, the first digitized data are then deleted from the memory circuit and the second digitized data are stored in the memory circuit.

A method for retro-storing or retro-playing analog information in a memory circuit includes the step of receiving and processing a plurality of analog data into digitized data for storage in the memory circuit. The digitized data are then stored in the memory circuit in a continuous loop manner. Then, detection is made to determine at which time the analog information requires storage when the digitized data are being stored in the memory circuit. A predetermined number of the digitized data last stored in the memory circuit back in time from the time at which the storage of the analog information is detected are preserved for retro-play or retro-storage.

An integrated storage circuit for retro-storing and retrieving analog information includes a signal converter for converting the analog information into digitized data. A buffer circuit is provided for buffering the digitized data. A memory is provided for storing the digitized data. A processing circuit is provided for processing the digitized data and for controlling the buffer circuit and the memory to store the digitized data. A control circuit is coupled to the memory, the buffer circuit, and the processing circuit for controlling the processing circuit to store the digitized data in the memory in response to a control signal. When the control signal is not asserted, the control circuit controls the processing circuit to receive and store the digitized data in the buffer circuit in a closed loop manner. When the control signal is asserted, the control circuit controls the processing circuit to store (1) the digitized data received after the control signal is asserted into the memory and (2) the digitized data already stored in the buffer circuit into the memory. The signal converter, the memory, the buffer circuit, the processing circuit, and the control circuit all reside on a single semiconductor substrate.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
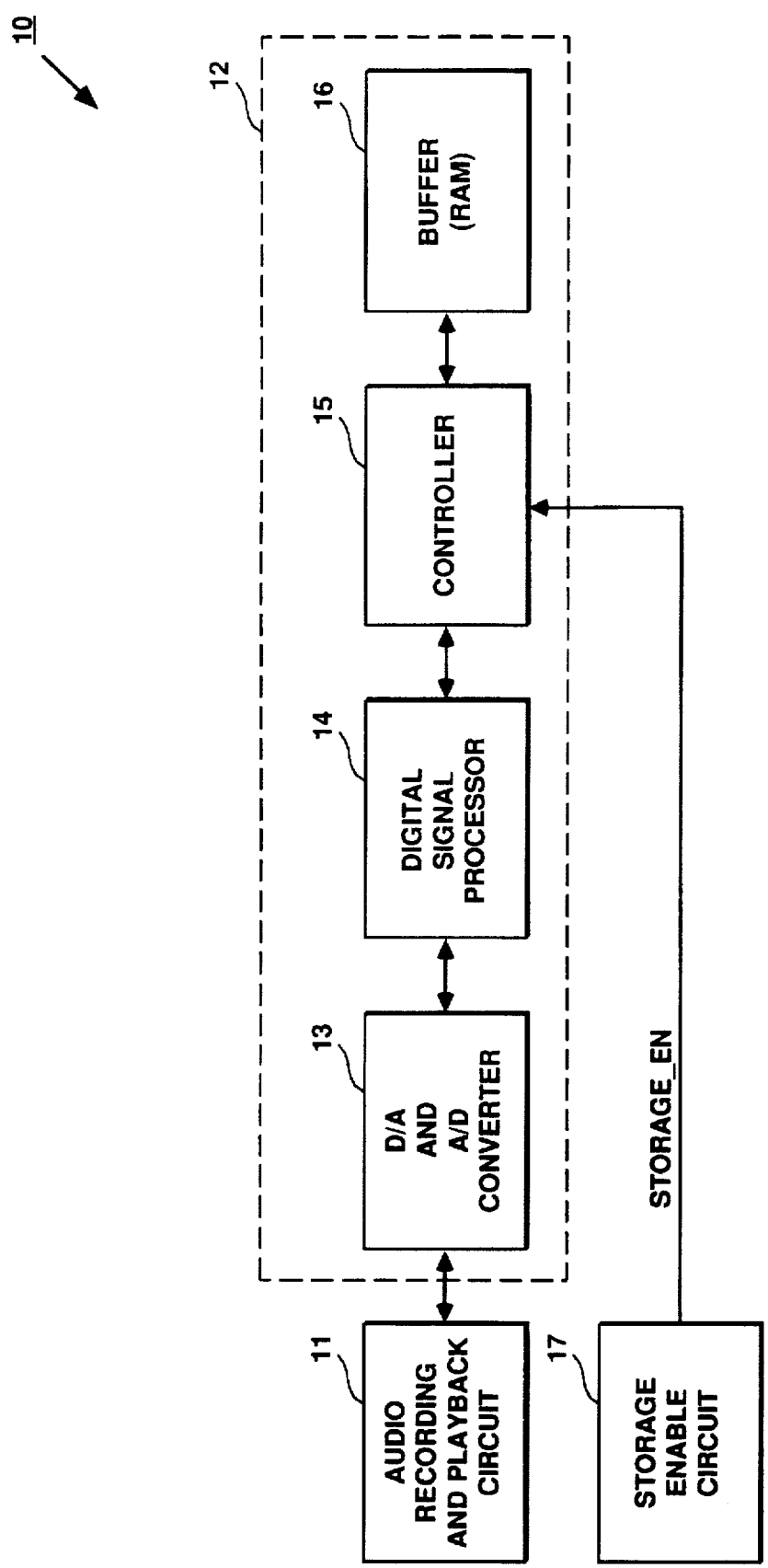
FIG. 1 is a block diagram of an audio recording and storage system that includes a digital storage circuit for retro-storing audio information in accordance with one embodiment of the present invention.

FIG. 1 shows the block diagram of an audio recording and storage system 10 that includes a digital storage circuit 12 for retro-storing analog (e.g., audio) information in accordance with an embodiment of the present invention. Alternatively, system 10 can be any other system. For example, system 10 can be a video recording system. As can be seen from FIG. 1, circuit 12 is connected to an audio recording and playback circuit 11 and a storage enable circuit 17 of audio recording and storage system 10.

Briefly, the audio recording and storage system in accordance with one embodiment of the present invention records and stores information in a continuous loop manner. When, at one point of recording and storage, a control signal is generated to the system to indicate that all the information stored after the control signal is generated should not be erased, the information stored at a predetermined distance back in time before the control signal is generated (e.g., 20 seconds) is also preserved such that the audio recording and storage system can retro-store audio or other analog information. This feature allows the system of the present invention to preserve or store information before the control signal is generated. This feature is especially useful in an audio recording system. For example, when the system of the present invention is used in a hearing-aid system and the user that uses the hearing-aid system suddenly wants to hear back what he or she has just missed, the user can push the button to retro-play what has been previously recorded within a predetermined time frame just before the button is pushed. By doing so, it is never too late for the user to preserve what he or she wants to preserve.

As described above, before the control signal is generated, the system of the present invention stores information in a continuous loop. The loop is relatively long in terms of storage length. When the loop is full, the earliest stored information is deleted in a first-in-first-out manner such that the audio recording and storage system can continuously store the information. When the control signal is generated, the system preserves the data retro-stored within a predetermined time frame right before the control signal is generated. The preserved data can then be used for retro-play.

Moreover, in accordance with another embodiment, when the control signal is generated, the system no longer deletes the information stored after the control signal is asserted. In addition, the system permanently preserves the data retro-stored within a predetermined time frame right before the control signal is generated until an erase instruction is received to erase them.

Referring to FIG. 1, audio recording and storage system 10 can be used in a variety of systems. For example, audio recording and storage system 10 can be used in a hearing-aid system, in an analog signal receiving and storage system, in an audio recording system, or in any other kind of analog signal storage system. In addition, the analog information stored in system 10 can contain audio information, video information, a combination of both, or any other type of analog information. Audio recording and storage system 10 can simply be an analog signal acquisition and storage system.

Audio recording and playback circuit 11 is used for recording audio information to be stored in digital storage circuit 12, and for playing back the audio information stored in circuit 12. For one embodiment, audio recording and playback circuit 11 includes a microphone, a speaker, and an audio recording and playback control circuit (all are not shown). The microphone, the speaker, and the audio recording and playback control circuit of circuit 11 are all implemented by known circuits or components.

For one embodiment, digital storage circuit 12 resides on a single silicon substrate. For a further embodiment, all the circuits of audio recording and storage system 10 are residing on a single silicon substrate, except for the microphone and speaker (not shown) of audio recording and playback circuit 11.

Digital storage circuit 12 converts the analog data received from audio recording and playback circuit 11 into digital form and stores the digitized analog data in accordance with a storage enable signal STORAGE_EN from storage enable circuit 17. Digital storage circuit 12 stores the digitized analog data in two ways, which will be described in more detail below.

Briefly, when storage enable circuit 17 does not generate the STORAGE_EN signal to digital storage circuit 12, circuit 12 stores the currently received digitized analog data in a continuous loop manner. If the loop is full, circuit 12 stores the currently received digitized analog data by deleting an equal amount of previously stored digitized analog data in a first-in-first-out manner. When storage enable circuit 17 generates the storage enable signal STORAGE_EN to digital storage circuit 12, circuit 12 breaks up the loop and simply stores the digitized analog data currently received from circuit 11. In addition, circuit 12 preserves data stored within a time frame right before the STORAGE_EN signal is asserted from being deleted when the STORAGE_EN signal is asserted. This allows digital storage circuit 12 to retro-store and retro-play digitized analog data received prior to the assertion of the STORAGE_EN signal. This feature of digital storage circuit 12 in accordance with one embodiment of the present invention will be described in more detail below, also in conjunction with FIGS. 2A and 2B.

Referring again to FIG. 1, storage enable circuit 17 can be any known signal generation circuit. Storage enable circuit 17 can be enabled by a person to generate the STORAGE_EN signal or by an external signal from an external circuit (not shown). When storage enable circuit 17 is activated by a person to generate the STORAGE_EN signal, a button is used for the circuit. When the person presses the button, circuit 17 assets the STORAGE_EN signal. When the user presses the button again, circuit 17 reasserts the STORAGE_EN signal. Alternatively, circuit 17 asserts the STORAGE_EN signal only during the time when the button remains pressed.

Storage enable circuit 17 is connected to a controller 15 of digital storage circuit 12. As can be seen from FIG. 1, circuit 12 also includes a buffer 16 connected to controller 15, a digital signal processor 14 connected to controller 15, and a D/A and A/D converter 13 connected to digital signal processor 14. Converter 13 is also connected to audio recording and playback circuit 11.

Converter 13 receives the analog signal from circuit 11. Converter 13 then converts the analog signal into digitized samples. The digitized samples are then applied to digital signal processor 14 for processing. Digital signal processor 14 then processes the digitized samples into digital data suitable for storage in buffer 16.

Converter 13 can be any known D/A and A/D converter. Similarly, digital signal processor 14 can also be any known digital signal processor. The processing functions of digital signal processor 14 includes digital data processing, data compression/decompression, and other functions. The processed digital data are then applied to controller 15. Controller 15 then controls the digital data to be stored in buffer 16 in accordance with the STORAGE_EN signal from storage enable circuit 17.

Controller 15 can be any known memory controller and buffer 16 can be any known buffer circuit or memory circuit. For one embodiment, buffer 16 is a RAM (Random Access Memory). For this embodiment, controller 15 is a RAM controller.

Controller 15 controls storage of the digital data received from digital signal processor 14 in buffer 16 in one of two ways in accordance with the STORAGE_EN signal. For one embodiment, when the STORAGE_EN signal is not asserted (i.e., storage of the recorded audio information is not required), controller 15 stores the digital data in buffer 16 in a first-in-first-out (FIFO) manner. The length of the FIFO can be selected in accordance with the user's choice. For example, the length of the FIFO can store the digital data equal to ten or twenty seconds of audio recording. As a further example, the length of the FIFO can store one minute of audio recording. Moreover, the length of the FIFO can be the entire storage space of buffer 16. Controller 15 stores one packet of the digital data into buffer 16 at one time.

When the FIFO is full, the earliest stored data packet will be replaced by the newly received data packet. This allows buffer 16 to store the digital data received from digital processor 14 in a continuous FIFO loop.

The FIFO loop of buffer 16 is broken as soon as the STORAGE_EN signal is asserted (i.e., storage of the recorded audio information is required). When this occurs, controller 15 no longer stores the digital data received from processor 14 in the first-in-first-out manner. When the STORAGE_EN signal is asserted, controller 15 simply stores the incoming data packets in buffer 16 without deleting any data packet previously stored in buffer 16. This therefore allows digital storage circuit 12 to retro-store audio information recorded by audio recording and playback circuit 11 before the STORAGE_EN signal is asserted. The process that is implemented by controller 15 to retro-store the digital data received from digital signal processor 14 in accordance with the STORAGE_EN signal will be described in more detail below, in conjunction with FIG. 2A.

Alternatively, when the length of the FIFO is the entire storage space of buffer 16, controller 15 only preserves a predetermined portion of the data packets previously stored immediately before the STORAGE_EN signal is asserted. For example, if the length of the FIFO can store digital data of five minute audio recording and only the last twenty second recorded audio information before the STORAGE_EN signal is asserted needs to be preserved for retro-play, controller 15 only preserves the digital data for the last twenty seconds of recording. Controller 15 may, however, delete other digital data previously stored in the FIFO before the STORAGE_EN signal is asserted.

Figure 2A:
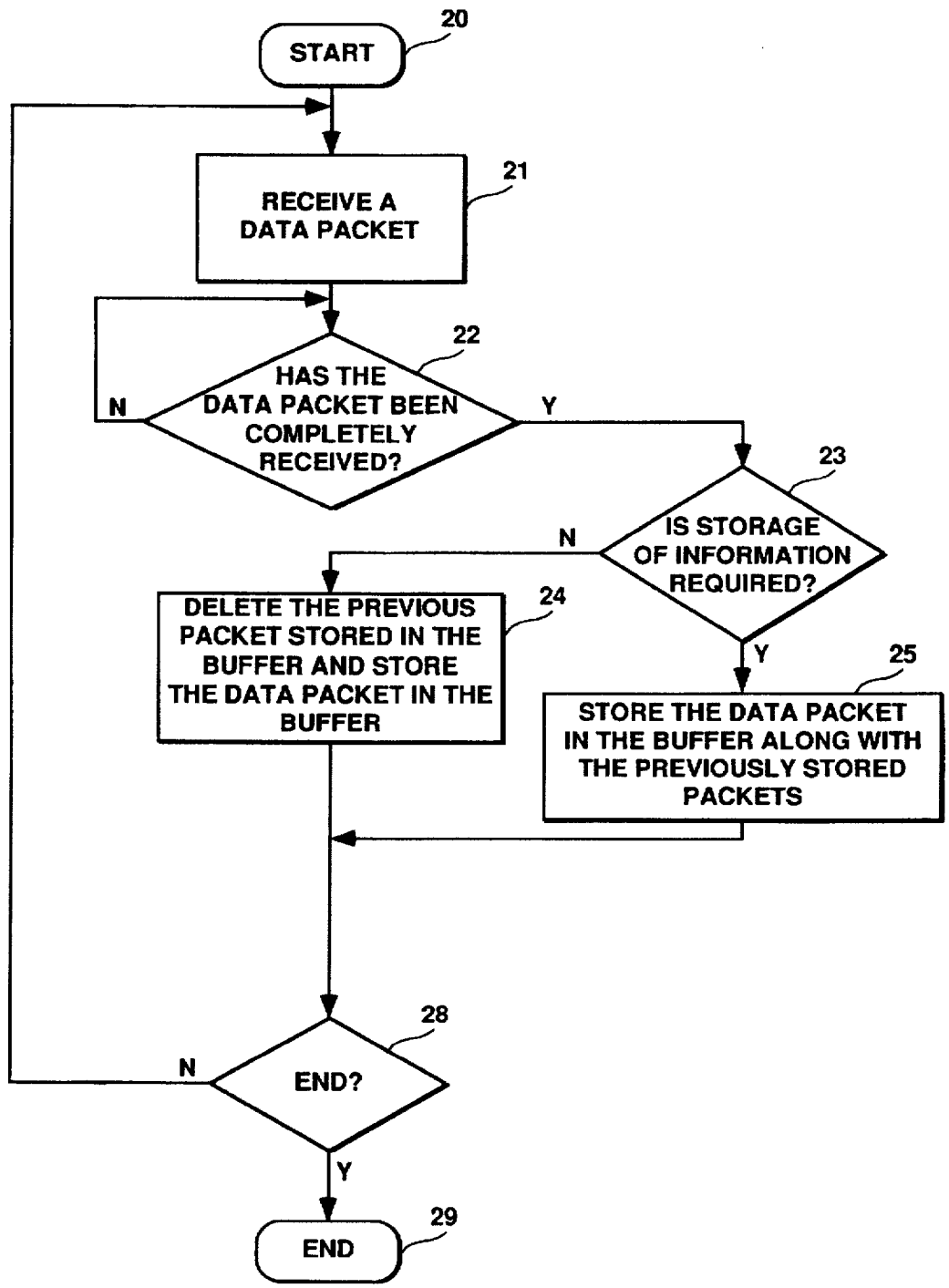
FIGS. 2A and 2B are flow chart diagrams of the processes for retro-storing the audio information implemented by the digital storage circuit of FIG. 1.

Referring to FIG. 2A, the process starts at step 20. At step 21, a data packet is received in controller 15. At step 22, if it is determined that the data packet has been completely received, then the process goes to step 23.

At step 23, it is determined if storage of information in buffer 16 is required. This is done by detecting whether the STORAGE_EN signal is asserted. If storage of information in buffer 16 is required, then step 25 becomes the next step. If storage of information in buffer 16 is not required, then step 24 becomes the next step.

At step 24, the earliest stored data packet in buffer 16 is deleted and the current data packet is stored in buffer 16. The process then goes to step 28. If, however, at step 23, it is determined that step 25 is the next step, then step 25 is performed. At step 25, the data packet is stored in buffer 16 along with the previously stored data packets. It shall be noted that at step 25, no previously stored data packet is deleted. This thus allows retro-storage of the data packets in buffer 16 that are received before storage of information in buffer 16 is required.

The process then goes to step 28, at which a determination is made to see if the process should end or not. If it is determined that the process should end, then step 29 is performed. If the process should not end, then step 21 is performed.

Referring back to FIG. 1, as described above, controller 15 controls storage of the digital data in buffer 16 in accordance with the STORAGE_EN signal. For another embodiment, when the STORAGE_EN signal is not asserted, controller 15 stores the digital data in buffer 16 in the FIFO manner. This time, the length of the FIFO is the entire storage space of buffer 16 which is adequately longer than the length of data to be retro-played or retro-retrieved. When the FIFO is full, the earliest stored data will be deleted to allow storage of the newly received data. Buffer 16 thus stores the newly received digital data.

When the STORAGE_EN signal is asserted, controller 15 can stop storing data in buffer 16. Here, the STORAGE_EN signal indicates when the retro-play is needed for the stored data. Controller 15 then stops storing data in buffer 16 and retrieves the predetermined amount of data last stored in buffer 16 immediately before the STORAGE_EN signal is asserted. This thus allows audio recording and storage system 10 to retro-play the data stored in buffer 16 before the STORAGE_EN signal is asserted. The process implemented by controller 15 to retro-play the digital data stored in buffer 16 in accordance with the STORAGE_EN signal according another embodiment of the present invention is described below, in conjunction with FIG. 2B.

Figure 2B:
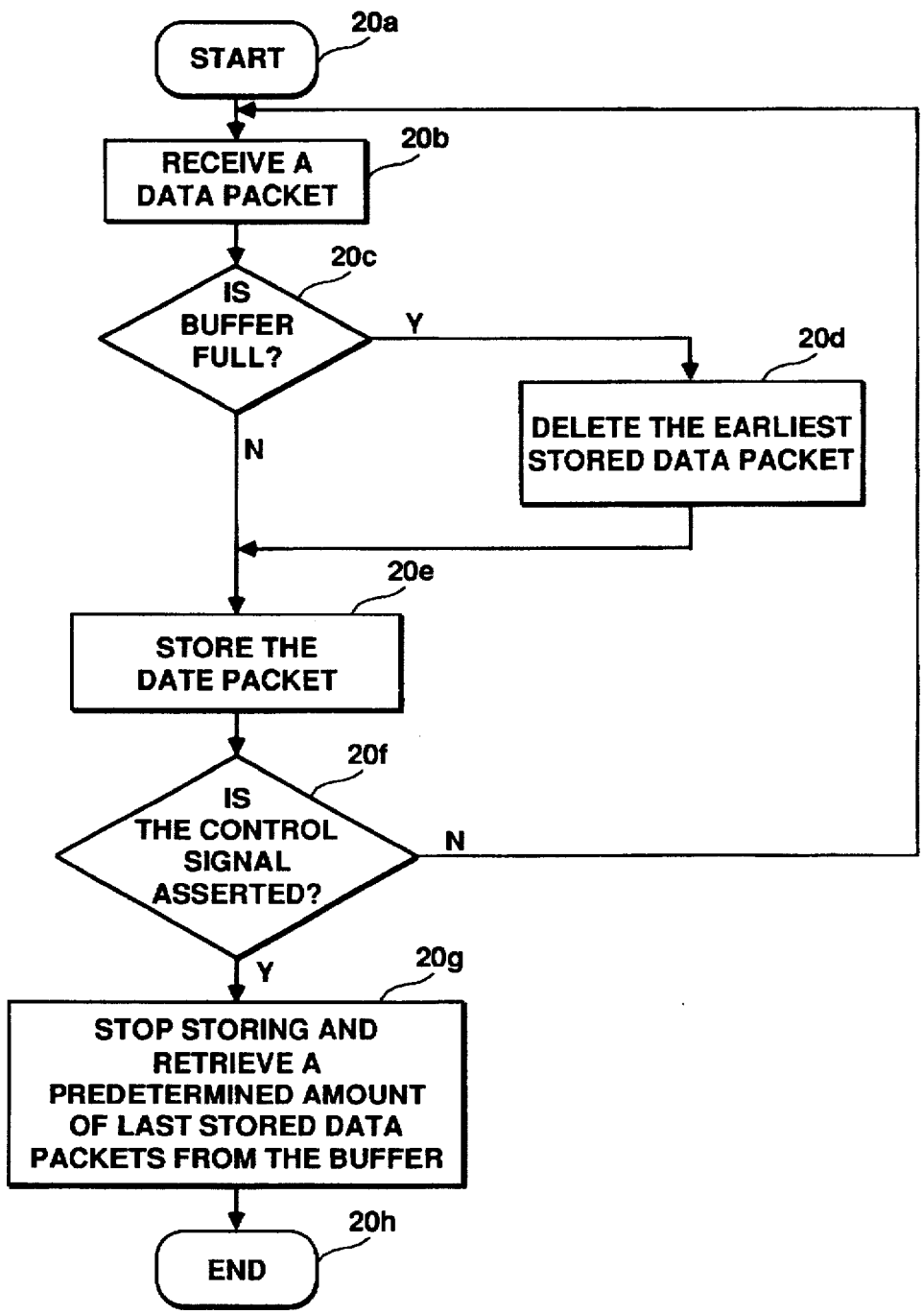

Referring to FIG. 2B, the process starts at step 20a. At step 20b, a data packet is received. At step 20c, it is determined whether buffer 16 is full. If buffer 16 is full, the process then goes to step 20d. If buffer is not full, step 20e is the next step.

At step 20d, the earliest stored data packet is deleted. Then the process goes to step 20e. At step 20e, the currently received data packet is stored in the FIFO manner. The process then goes to step 20f.

Step 20f is a judgment step at which it is determined whether the STORAGE_EN signal is asserted. If not, it means no retro-play is required and the process returns to the step 20b. If the answer is yes, then step 20g is performed at which the predetermined amount of data (e.g., for the last twenty-second recording) last stored in buffer 16 is retrieved or played for retro-play. The process then ends at step 20h.

Figure 3:
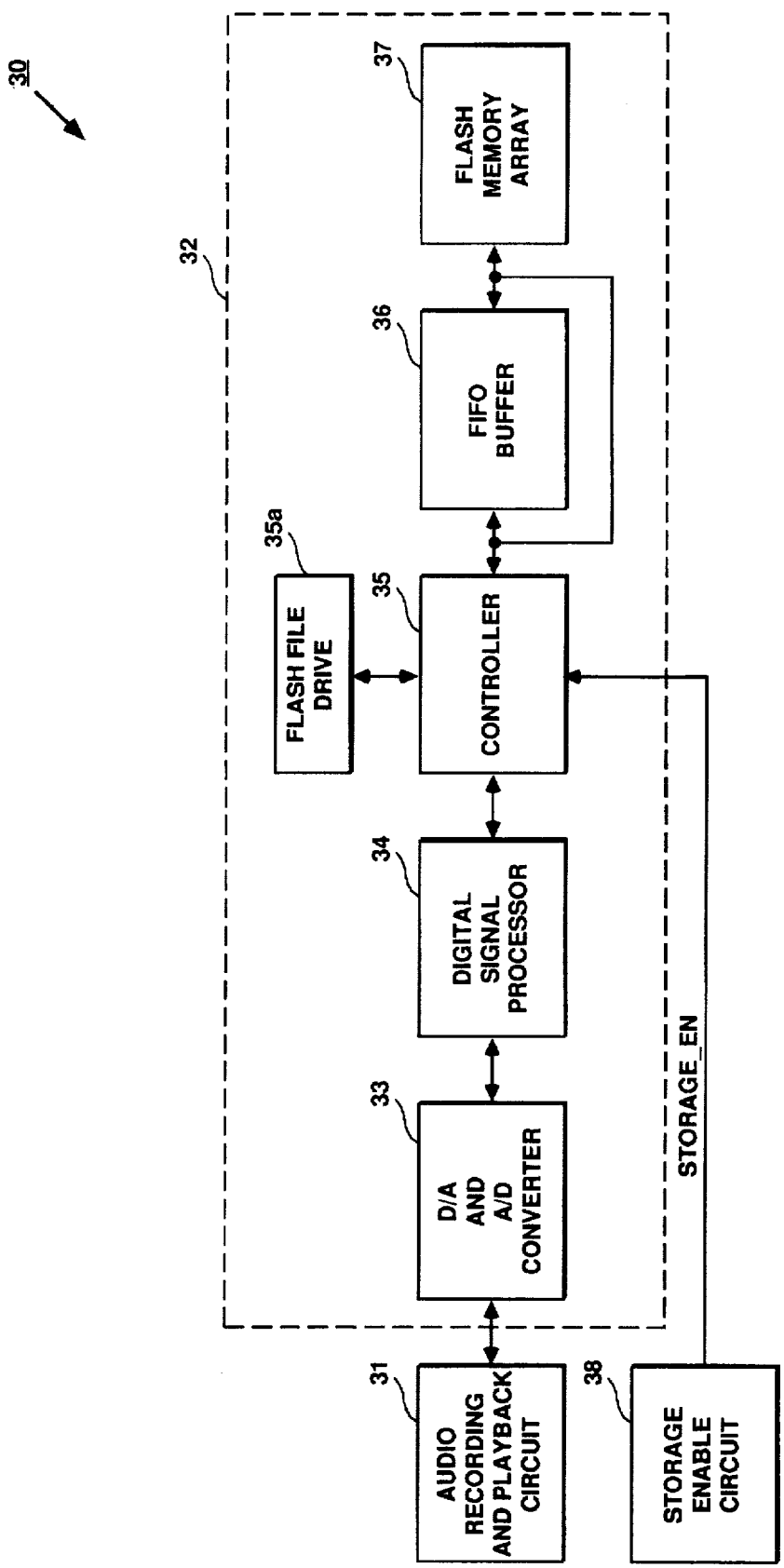
FIG. 3 is a block diagram of another audio recording and storage system that includes another digital storage circuit for retro-storing the audio information in accordance with another embodiment of the present invention.

FIG. 3 illustrates the block diagram of another audio recording and storage system 30 in accordance with another embodiment of the present invention. As can be seen from FIG. 3, system 30 includes a digital storage circuit 32 for allowing retro-storage of analog information received from an audio recording and playback circuit 31.

As can be seen from FIGS. 1 and 3, system 30 of FIG. 3 is the same as system 10 of FIG. 1, except that digital storage circuit 32 of system 30 of FIG. 3 includes a flash memory array 37 and a flash file drive 35a, in addition to all the elements shown in FIG. 1.

Referring again to FIG. 3, audio recording and storage system 30 can also be employed in different systems. For example, system 30 can be used in a hearing-aid system with retro-hearing function, in an analog signal acquisition and storage system, in any other king of analog signal storage system that has retro-storage function. The analog information may include audio, video, the combination of both, or any other type of analog information. In addition, system 30 can simply be an analog signal acquisition and storage system.

For one embodiment, digital storage circuit 32 resides on a single silicon substrate. Alternatively, all the circuits of system 30 reside on a single silicon substrate.

Audio recording and playback circuit 31 of FIG. 3 corresponds to audio recording and playback circuit 11 of FIG. 1 and storage enable circuit 38 of FIG. 3 corresponds to storage enable circuit 17 of FIG. 1. As a result, these circuits with their functions and their alternatives will not be described in more detail below.

As can be seen from FIG. 3, storage enable circuit 38 is used to control digital storage circuit 32 to start storing information received from circuit 31. In addition, storage enable circuit 38 also enables the retro-storage function of circuit 32 when circuit 32 is enabled to store information. Storage enable circuit 38 generates a STORAGE_EN signal to circuit 32 for enabling circuit 32 to store information.

Circuit 32 stores the information received from audio recording and playback circuit 31 in buffer 36 in a first-in-first-out manner when the STORAGE_EN signal is not assembled. When the STORAGE_EN signal is asserted, circuit 32 stores the information received from audio recording and playback circuit 31 into flash memory array 37. In addition, circuit 32 also stores the information already stored in buffer 36 into flash memory array 37. This thus allows digital storage circuit 32 to retro-store information received before the STORAGE_EN signal is asserted into flash memory array 37. This retro-storage function of circuit 32 will be described in more detail below, in conjunction with FIGS. 4-5.

Referring again to FIG. 3, flash memory array 37 of digital storage circuit 32 is made up of flash memory cells for storing data at addresses. For one embodiment, each memory cell of flash memory array 37 can store a single bit of data. For another embodiment, each memory cell of flash memory array 37 can store multiple bits of data.

Flash memory array 37 is arranged into a number of blocks (not shown). Each block of flash memory array 37 can be individually read, programmed, and erased. This means that each block of flash memory array 37 can be individually accessed for read, programming, and erasure operations.

Digital storage circuit 32 also includes a controller 35 connected to flash memory array 37. Controller 35 is also connected to FIFO buffer 36. Buffer 36 is also connected to flash memory array 37. Controller 35 is a memory controller that controls data storage in flash memory array 37. Controller 35 controls the memory operations of memory array 37. In addition, controller 35 controls data storage in buffer 36 in the first-in-first-out manner. As described above, the memory operations of memory array 37 include read, programming, and erasure operations. Moreover, controller 35 executes a flash file drive software 35a to store and read data files to and from memory array 37 and to manage the data files stored in memory array 37. Flash file drive 35a can be the flash file drive or memory management system described in a pending patent application Ser. No. 08/314,852, filed on Sep. 29, 1994 by Waiter S. Matthews and Markus A. Levy, and entitled A MEMORY MANAGEMENT SYSTEM FOR A NONVOLATILE MEMORY THAT REQUIRES MINIMIZED STORAGE SPACE AND PROCESSING. Flash file drive 35a will not be described in more detail below.

Controller 35 can be any kind of known flash memory controller. For one embodiment, controller 35 is implemented by a firmware. Alternatively, controller 35 can be implemented by other known controller circuits.

Flash file drive 35a can be stored in an on-chip volatile or nonvolatile memory of controller 35. In addition, flash file drive 35a may be stored in flash memory array 37. When this occurs, controller 35 may either download flash file drive 35a from flash memory array 37 or directly execute it from flash memory array 37 (i.e., execute-in-place).

Controller 35 also executes a process in accordance with one embodiment of the present invention to store the digital data received from digital signal processor 34 in either buffer 36 or flash memory array 37 in accordance with the STORAGE_EN signal. When the STORAGE_EN signal is not asserted, controller 35 stores the data received from digital signal processor 34 in buffer 36 in the first-in-first-out manner. The length of FIFO buffer 36 can be selected at user's desire. Controller 35 stores one packet of digital data in buffer 36 at one time. When buffer 36 if full, the earliest stored data packet is deleted from buffer 36. This allows buffer 36 to store data in a continuous FIFO loop. At this time, flash memory array 37 does not store any data received from digital signal processor 34.

Controller 35 starts to store data packets in flash memory array 37 as soon as the STORAGE_EN signal is asserted. When this occurs, controller 35 stores all data packets to be received from digital signal processor 34 into flash memory array 37. In addition, controller 35 moves all the data packets previously stored in buffer 36 into flash memory array 37. This thus allows digital storage circuit 32 to retro-store information received before the STORAGE_EN signal is asserted.

When the STORAGE_EN signal is asserted, controller 35 uses flash file drive 35a to manage storage of data packets in flash memory array 37. The file management operation of flash file drive 35a with respect to storing data in flash memory array 37 is substantially the same as that of the memory management system described in the co-pending application Ser. No. 08/314,852, and therefore will not be described in more detail below.

Briefly, in one embodiment, flash file drive 35a sequentially stores one data packet in one block of flash memory array 37. Flash file drive 35a then marks that block as programmed with a flag bit of that particular block. When the stored data need to be retrieved, flash file drive 35a sequentially steps through the corresponding blocks to read the data packets out. When the stored data packets need to be erased, flash file drive 35a then performs the erasure operation to the corresponding blocks which also erases the flag bit of these blocks.

As described above, when the STORAGE_EN signal is asserted, controller 35 also stores the data packets previously stored in buffer 36 into flash memory array 37. In one embodiment, controller 35 continues to store the incoming data packet in buffer 36. Meanwhile, controller 35 also controls the earliest stored data packet in buffer 36 to be stored in flash memory array 37. In this way, the data packets stored before the STORAGE_EN signal is asserted can then be stored in flash memory array 37.

For another embodiment, when the STORAGE_EN signal is asserted, controller 35 applies all the data packets received to flash memory array 37. As soon as the STORAGE_EN signal is deasserted, controller 35 then writes all the data packets stored in buffer 36 into flash memory array 37. The processes implemented by controller 35 to store data in flash memory array 37 in accordance with the STORAGE_EN signal and to read the stored data from flash memory array 37 will be described in more detail below, in conjunction with FIGS. 4 and 5.

Figure 4:
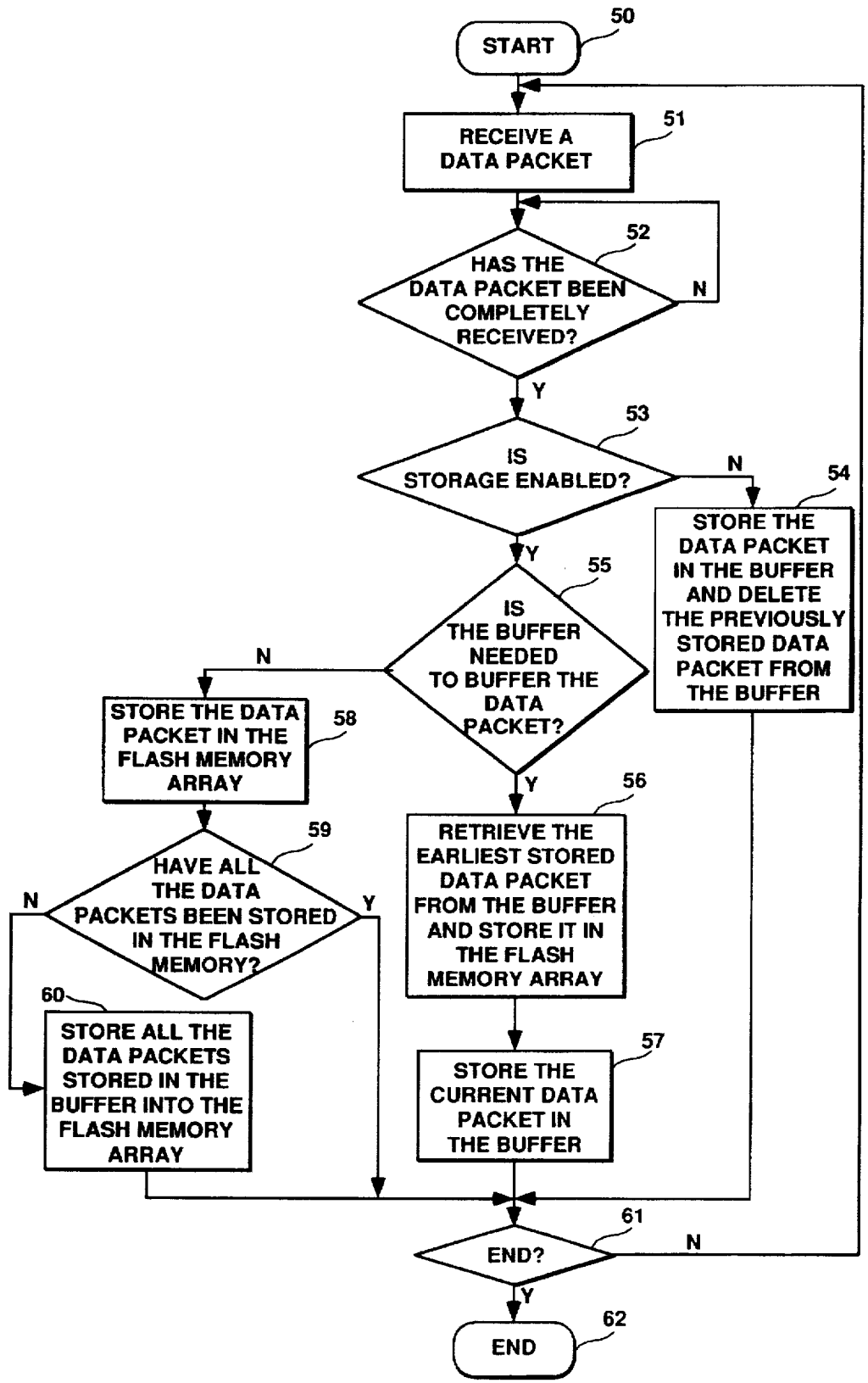
FIG. 4 is a flow chart diagram of the process of retro-storing the audio information implemented by the digital storage circuit of FIG. 3.

Referring to FIG. 4, the process of storing data in flash memory array 37 starts at step 50. At step 51, controller 35 starts to receive a data packet from digital signal processor 34. At step 52, a judgment is made to determine if the data packet has completely been received. When the data packet has been completely received, step 53 is then performed to determine if storage of information is enabled. This is done by determining whether the STORAGE_EN signal is asserted. If the STORAGE_EN signal is asserted, the process goes to step 55. When the STORAGE_EN signal is not asserted, the process goes to step 54.

At step 54, controller 35 stores the data packet in buffer 36 and deletes the earliest data packet stored in buffer 36 from buffer 36. The process then goes to step 61.

When the storage of information is required, step 55 is performed. At step 55, a judgment is made to determine if buffer 36 should still be used to buffer the data packet to be stored in flash memory array 37 (i.e., to implement one of the two embodiments described above). If the answer is yes, then steps 56 and 57 are performed. If the answer is no, then steps 58 through 60 are performed.

At step 56, the earliest stored data packet in buffer 36 is retrieved and stored into flash memory array 37. At step 57, the currently received data packet is stored in buffer 36 in the same first-in-first-out manner, thus achieving the retro-storage function digital storage circuit 32. The process then goes to step 61.

When, at step 55, it is determined that buffer 36 is no longer needed for buffering data packets to be stored in flash memory array 37, then the process goes to step 58, at which the currently received data packet is stored in flash memory array 37. At step 59, it is further determined whether all the data packets stored in buffer 36 has been stored in flash memory array 37. If the answer is yes, then step 61 is performed. If the answer is no, then step 60 is performed, at which all the data packets previously stored in buffer 36 are then stored into flash memory array 37. This also achieves the retro-storage function of digital storage circuit 32. The process then goes to step 61.

At step 61, it is determined if the process should end. If it should end, then the process ends at step 62. If the process should not end, then the process returns to step 51.

Figure 5:
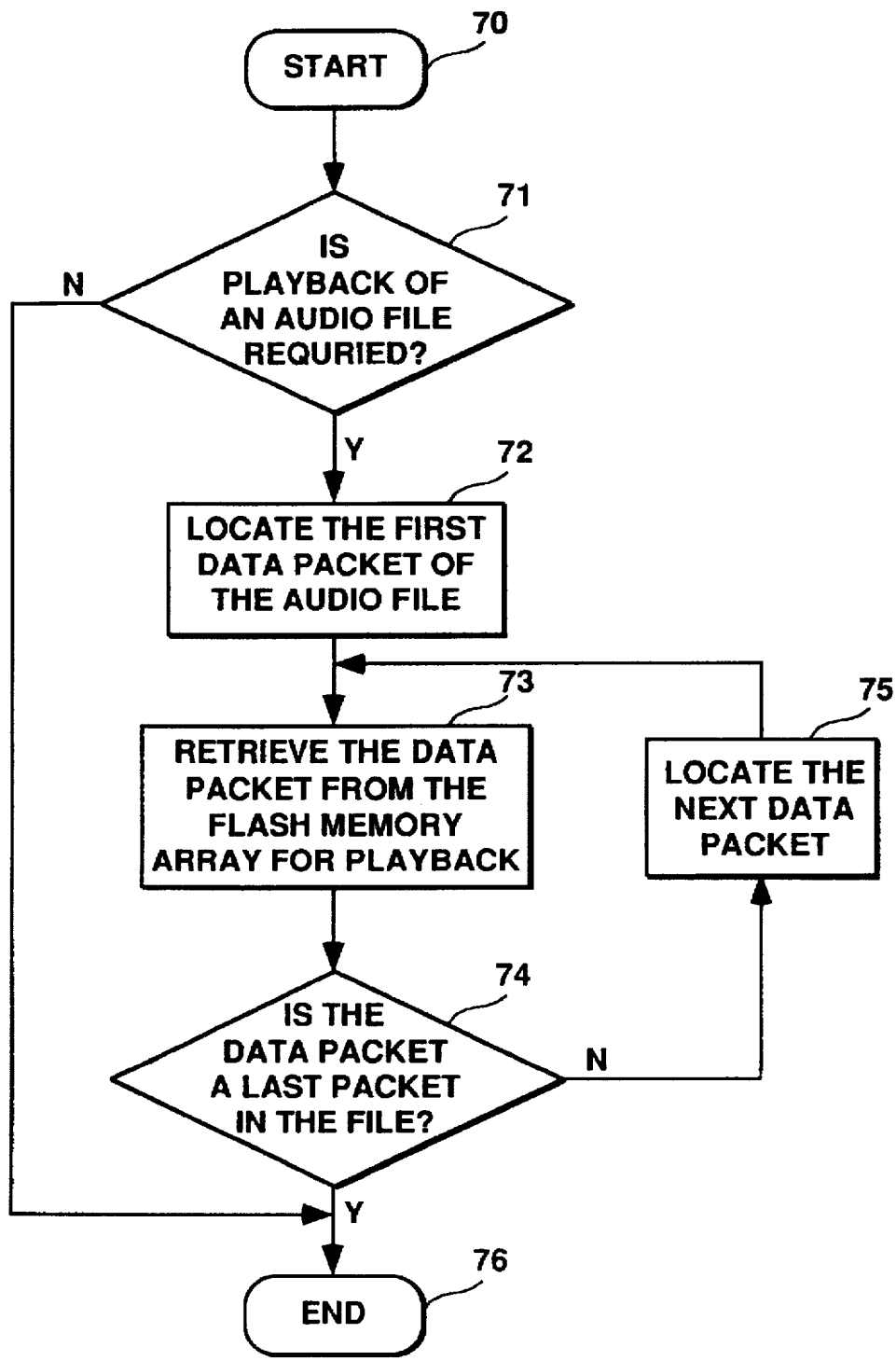
FIG. 5 is a flow chart diagram of the process of retrieving the audio information stored in the digital storage circuit of FIG. 3.

FIG. 5 shows the process of controller 35 of FIG. 3 in retrieving the data packets from flash memory array 37. As can be seen from FIG. 5, the process determines if the stored data packets need to be retrieved at step 71. If the answer is yes, then the first data packet of the file is located and retrieved at steps 72 and 73, with the help of flash file drive 35a of FIG. 3. If the answer is no, then the process ends at step 76.

At step 74, it is determined whether the data packet is the last one of the file. If the answer is yes, then the process ends at step 76. If the answer is no, then step 75 is performed to locate the next data packet, also with the help of flash file drive 35a.

In the foregoing specification, the invention has been described with reference to specific embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for retro-storing analog information, comprising first analog data and second analog data, in a memory circuit, comprising the steps of:

(A) receiving and processing the first analog data into first digitized data for storage in the memory circuit;

(B) storing the first digitized data in the memory circuit;

(C) receiving and processing the second analog data into second digitized data for storage in the memory circuit;

(D) determining if storage of the analog information is required;

(E) if storage of the analog information is required, then storing the second digitized data with the first digitized data in the memory circuit such that when the second digitized data are retrieved, both the first digitized data and the second digitized data are retrieved from the memory circuit; and (F) if storage of the analog information is not required, then deleting the first digitized data from the memory circuit and storing the second digitized data in the memory circuit.

2. The method of claim 1, further comprising the step of enabling storage of the analog information in the memory circuit prior to the step (C).

3. The method of claim 2, wherein (1) the first analog data are generated within a first predetermined time prior to the enabling of the storage of the analog information and (2) the second analog data are generated within a second predetermined time from the timing at which storage of the analog information is enabled.

4. The method of claim 3, wherein said analog information further includes a third analog data, and the step (E) further comprises the steps of:

(i) receiving and processing the third analog data into third digitized data for storage in the memory circuit;

(ii) determining if storage of the analog information is still required;

(iii) if storage of the analog information is still required, then storing the third digitized data with the first and second digitized data in the memory circuit;

(iv) if storage of the analog information is no longer required, then
  (a) determining if the memory circuit is full;
  (b) storing the third digitized data in the memory circuit along with the first and second digitized data if the memory circuit is not full;
  (c) deleting the first digitized data from the memory circuit and storing the third digitized data in the memory circuit along with the second digitized data if the memory circuit is full.

5. The method of claim 3, wherein the memory circuit further comprises a buffer circuit, wherein the method further comprises the step of transferring the first and second digitized data from the buffer circuit to a nonvolatile memory if storage of the analog information is required.

6. The method of claim 3, wherein the analog information is audio information.

7. A method for retro-storing analog information comprising a plurality of analog data, in a memory circuit, comprising the steps of:
   (A) receiving and processing the plurality of analog data into digitized data for storage in the memory circuit;
   (B) storing the digitized data in the memory circuit in a continuous loop manner;
   (C) detecting a signal indicating that storage of the analog information is required;
   (D) preventing a predetermined number of the digitized data last stored in the memory circuit before the signal is detected from being deleted, in order to retro-store the analog information.

8. The method of claim 7, step (B) further comprising the steps of:
   determining if the memory circuit is full before storing each of the digitized data in the memory circuit;
   deleting an earliest stored one of the digitized data from the memory circuit if the memory circuit is determined full when the digitized data are being stored in the memory circuit in order to maintain the continuous loop.

9. The method of claim 7, further comprising the step of retrieving the predetermined number of the digitized data last stored for retro-play.

10. A method for retro-storing audio information comprising a first audio message and a second audio message in a nonvolatile memory, comprising:
   (A) receiving and processing the first audio message into first digitized data;
   (B) storing the first digitized data in a buffer circuit;
   (C) receiving and processing the second audio message into second digitized data;
   (D) determining if storage of the audio information is required;
   (E) if storage of the audio information is required, then
      (i) storing the first digitized data into the nonvolatile memory from the buffer circuit;
      (ii) storing the second digitized data into the nonvolatile memory, such that when the second digitized data is retrieved, both the first and second digitized data are retrieved from the nonvolatile memory;
   (F) if storage of the audio information is not required, then deleting the first digitized data from the buffer circuit and storing the second digitized data in the buffer circuit.

11. The method of claim 10, further comprising the step of enabling storage of the audio information in the nonvolatile memory prior to the step (C), wherein the nonvolatile memory is an electrically erasable and programmable memory, wherein the buffer circuit includes a volatile memory.

12. The method of claim 11, wherein (1) the first audio message is generated within a predetermined time prior to a timing at which storage of the audio information is enabled and (2) the second audio message is generated within the predetermined time from the timing at which storage of the audio information is required.

13. The method of claim 12, wherein the audio information further comprises a third audio message, and the step (E) further comprises the steps of:
   (i) receiving and processing the third audio message into third digitized data;
   (ii) determining if storage of the audio information is still required;
   (iii) if storage of the audio information is still required, then storing the third digitized data with the first and second digitized data in the nonvolatile memory;
   (iv) if storage of the audio information is no longer required, then storing the third digitized data in the buffer circuit.

14. An integrated circuit for retro-storing and retrieving analog information, comprising:
   (A) a signal converter for converting the analog information into digitized data;
   (B) a buffer circuit for buffering the digitized data;
   (C) a memory for storing the digitized data;
   (D) a processing circuit for processing the digitized data and for controlling the buffer circuit and the memory to store the digitized data;
   (E) a control circuit coupled to the memory, the buffer circuit, and the processing circuit for controlling the processing circuit to store the digitized data in the memory in response to a control signal, wherein when the control signal is not asserted, the control circuit controls the processing circuit to store the digitized data in the buffer circuit in a continuous loop manner, wherein when the control signal is asserted, the control circuit controls the processing circuit to store into the memory (1) the digitized data received after the control signal is asserted and (2) the digitized data already stored in the buffer circuit.

15. The integrated circuit of claim 14, wherein the memory is an electrically erasable and programmable memory and the buffer circuit includes a volatile memory.

16. The integrated circuit of claim 14, wherein the loop includes a predetermined amount of the digitized data received prior to a timing at which the control signal is asserted such that information prior to the assertion of the control signal can be saved and retrieved.

17. The integrated circuit of claim 14, wherein when the buffer circuit stores the digitized data until the loop is full, wherein when the loop is full, the buffer circuit continues to store new data by deleting an equal amount of data in the loop in a first-in-first-out manner if the control signal remains not asserted.

18. The integrated circuit of claim 14, wherein the analog information includes audio information, wherein the control circuit controls the processing circuit to continue storing the digitized data received after the control signal is asserted to the memory until the control signal is deasserted.

* * * * *

UNITED STATES PATENT AND TRADEMARK OFFICE
CERTIFICATE OF CORRECTION

| | | |
|---|---|---|
| PATENT NO. | : | 5,687,279 |
| DATED | : | November 11, 1997 |
| INVENTOR(S) | : | Walter S. Matthews |

It is certified that error appears in the above-identified patent and that said Letters Patent is hereby corrected as shown below:

In column 7 at line 38 delete "assembled" and insert --asserted--

Signed and Sealed this

Seventeenth Day of March, 1998

*Attest:*

BRUCE LEHMAN

*Attesting Officer*  *Commissioner of Patents and Trademarks*